United States Patent
Yoo et al.

(10) Patent No.: US 11,533,029 B2
(45) Date of Patent: Dec. 20, 2022

(54) POWER AMPLIFIER, POWER AMPLIFIER SYSTEM AND OPERATING METHOD THEREOF

(71) Applicant: Samsung Electro-Mechnics Co., Ltd., Suwon-si (KR)

(72) Inventors: Hyunjin Yoo, Suwon-si (KR); Youngsik Hur, Suwon-si (KR); Kangta Jo, Suwon-si (KR); Suyeon Han, Suwon-si (KR); Jinyong Kim, Suwon-si (KR); Wonsun Hwang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 205 days.

(21) Appl. No.: 17/073,838

(22) Filed: Oct. 19, 2020

(65) Prior Publication Data
US 2022/0038067 A1 Feb. 3, 2022

(30) Foreign Application Priority Data
Jul. 31, 2020 (KR) .......... 10-2020-0096327

(51) Int. Cl.
*H03F 1/30* (2006.01)
*H03F 3/24* (2006.01)
*H03F 3/195* (2006.01)

(52) U.S. Cl.
CPC .......... *H03F 3/245* (2013.01); *H03F 3/195* (2013.01); *H03F 2200/252* (2013.01); *H03F 2200/451* (2013.01); *H03F 2200/504* (2013.01)

(58) Field of Classification Search
CPC ............ H03F 1/30; H03F 3/20; H03G 3/30
USPC ...................................... 330/297, 296
See application file for complete search history.

(56) References Cited

U.S. PATENT DOCUMENTS

| 5,029,005 | A | * | 7/1991 | Morris, Jr. | H04N 5/60 |
| | | | | | 348/E5.122 |
| 7,123,096 | B2 | | 10/2006 | Selin | |
| 7,486,134 | B2 | | 2/2009 | Chang et al. | |
| 7,592,677 | B2 | * | 9/2009 | Cave | H01L 29/41758 |
| | | | | | 257/392 |
| 8,406,706 | B2 | | 3/2013 | Heo et al. | |
| 9,246,460 | B2 | * | 1/2016 | Khlat | H02M 3/158 |
| 10,985,714 | B2 | * | 4/2021 | Deng | H03G 3/001 |

FOREIGN PATENT DOCUMENTS

| KR | 10-0487347 B1 | 5/2005 |
| KR | 10-1354222 B1 | 1/2014 |
| KR | 10-1689602 B1 | 12/2016 |

* cited by examiner

*Primary Examiner* — Henry Choe
(74) *Attorney, Agent, or Firm* — NSIP Law

(57) ABSTRACT

A power amplifier, a power amplifier system, and an operating method thereof are provided. The power amplifier system may include a power amplifier, a power amplifier controller, and a voltage generator. The power amplifier may include a plurality of power transistor cells each of which receives an RF signal through a control terminal thereof to amplify the RF signal. The power amplifier controller may control turn-on and turn-off operations of at least one power transistor cell among the plurality of power transistor cells based on a power mode. The voltage generator may generate a power supply voltage supplied to first terminals of the power transistor cells and may change the power supply voltage depending on the power mode.

20 Claims, 11 Drawing Sheets

POWER AMPLIFIER, POWER AMPLIFIER SYSTEM AND OPERATING METHOD THEREOF

CROSS-REFERENCE TO RELATED APPLICATION

This application claims the benefit under 35 USC 119(a) of Korean Patent Application No. 10-2020-0096327 filed on Jul. 31, 2020, in the Korean Intellectual Property Office, the entire disclosure of which is incorporated herein by reference for all purposes.

BACKGROUND

1. Field

The following description relates to a power amplifier, a power amplifier system, and an operating method thereof.

2. Description of Related Art

Wireless communication systems may apply various digital modulation and demodulation methods depending on the evolution of communication standards. An existing code division multiple access (CDMA) communication system employs a quadrature phase shift keying (QPSK) method, and a wireless LAN, depending on an IEEE communication standard, employs an orthogonal frequency division multiplexing (OFDM) method. Additionally, recent 3GPP standards such as long-term evolution (LTE), LTE-advanced, and 5G, may employ the QPSK method, a quadrature amplitude modulation (QAM) method, and the OFDM method. These wireless communication standards may employ a linear modulation method wherein a size or phase of a transmission signal is maintained during transmission.

A transmission device used in a wireless communication system may include a power amplifier that amplifies a radio frequency (RF) signal in order to increase a transmission distance. The power amplifier is a circuit positioned at an end portion of the transmission device, and plays an important role in performance of the transmission device. Since output power, linearity, and power efficiency may be determined by the power amplifier, the power amplifier is a very important circuit. Particularly, power and efficiency of the power amplifier are very important for the power amplifier used in the wireless communication system. An adaptive power tracking (APT) technique, an envelope tracking technique, and the like may be used to improve the power and efficiency.

It may be necessary that output impedance of the power amplifier is optimally set to improve the efficiency of the power amplifier. For this purpose, a separate circuit to tune a load of the power amplifier may be implemented, and overall performance of the power amplifier may be degraded due to separate elements for load tuning.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power amplifier system includes a power amplifier including a plurality of power transistor cells, each of the plurality of power transistor cells configured to receive a radio frequency (RF) signal through a control terminal, and amplify the received RF signal; a power amplifier controller, configured to control a turn-on operation and a turn-off operation of at least one power transistor cell among the plurality of power transistor cells based on a power mode; and a voltage generator, configured to generate a power supply voltage and transmit the generated power supply voltage to first terminals of the power transistor cells, and to change the power supply voltage based on the power mode.

The power mode may include a first power mode and a second power mode that outputs a lower power than a power of the first power mode, and the power amplifier controller may be configured to control the turn-off operation of the at least one power transistor cell in the second power mode.

The voltage generator may be configured to supply the power supply voltage having a first voltage in the first power mode to the first terminals of the power transistor cells, and the voltage generator may be configured to supply the power supply voltage having a second voltage that is lower than the first voltage in the second power mode to the first terminals of the power transistor cells.

The power amplifier controller may be configured to control the turn-on operation of the power transistor cells in the first power mode.

The power amplifier may further include a bias supply, configured to generate a bias voltage that is inputted into control terminals of the power transistor cells; and a switching unit, configured to switch supply of the bias voltage to the control terminals of the power transistor cells.

The switching unit may not supply the bias voltage to a control terminal of the at least one power transistor cell to turn off the at least one power transistor cell.

The power amplifier may further include a resistor connected between the switching unit and the power transistor cells.

The bias supply may include a first transistor, configured to include a control terminal and a first terminal that are connected to each other, and a second terminal that is connected to a ground; and a current source, configured to supply a current to the control terminal and the first terminal of the first transistor, wherein the bias voltage is a voltage of the control terminal of the first transistor.

The switching unit may include a plurality of switches that are respectively connected to a control terminal of the first transistor and a control terminal of each of the power transistor cells.

The power amplifier may further include a second transistor connected between first terminals of the power transistor cells and the power supply voltage, and having a cascode connection with the power transistor cells.

In a general aspect, a power amplifier includes a first power transistor cell, configured to receive a radio frequency (RF) signal through a control terminal thereof, and to amplify the received RF signal; a second power transistor cell, configured to receive an RF signal through a control terminal thereof and to amplify the received RF signal; a bias supply, configured to generate a bias voltage; and a switching unit, configured to switch a supply of the bias voltage to the control terminal of the first power transistor cell and the control terminal of the second power transistor cells based on a power mode, wherein a power supply voltage supplied to first terminals of the first and second power transistor cells is varied based to the power mode.

The power mode may include a first power mode and a second power mode that outputs lower power than a power of the first power mode, and the switching unit, in the second power mode, may be configured to supply the bias voltage to the control terminal of the first power transistor cell, and does not supply the bias voltage to the control terminal of the second power transistor cell.

The power supply voltage may have a first voltage in the first power mode, and the power supply voltage has a second voltage that is smaller than the first voltage in the second power mode.

The switching unit may be configured to supply the bias voltage to the control terminals of the first power transistor cell and the second power transistor cell in the first power mode.

The switching unit may include a first switch connected between the bias supply and the control terminal of the first power transistor cell, and a second switch connected between the bias supply and the control terminal of the second power transistor cell.

The bias supply may include a first transistor, configured to have a control terminal and a first terminal that are connected to each other, and a second terminal that is connected to a ground; and a current source, configured to supply a current to the control terminal and the first terminal of the first transistor, wherein the bias voltage is a voltage of the control terminal of the first transistor.

The power amplifier may further include a first resistor connected between the switching unit and the control terminal of the first power transistor cell; and a second resistor connected between the switching unit and the control terminal of the second power transistor cell.

In a general aspect, an operating method of a power amplifier including a plurality of power transistor cells to amplify radio frequency (RF) signals includes amplifying the RF signal while turning on the power transistor cells in a first power mode; amplifying the RF signal while turning off at least one power transistor cell among the power transistor cells in a second power mode that outputs lower power than a power of the first power mode; supplying a first power supply voltage having a first voltage to first terminals of the power transistor cells in the first power mode; and supplying a second power supply voltage having a second voltage that is lower than the first voltage to the first terminals of the power transistor cells in the second power mode.

The amplifying of the RF signal in the first power mode may include supplying a bias voltage to control terminals of the power transistor cells, and the amplifying of the RF signal in the second power mode may include blocking supply of the bias voltage to a control terminal of the at least one power transistor cell.

The first power mode may be a high-power mode, and the second power mode may be a low-power mode.

In a general aspect, a power amplifier system includes a power amplifier, comprising a plurality of power transistor cells; a voltage generator; and a power amplifier controller configured to: receive a power mode input signal; output a voltage control signal corresponding to the received power mode input signal to the voltage generator; and control a switching operation of the power amplifier based on the received power mode input signal by selectively turning on or turning off one or more of the plurality of power transistor cells.

The power mode may include one of a first power mode, a second power mode having a voltage level higher than a voltage level of the first power mode, and a third power mode having a voltage level higher than the voltage level of the second power mode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
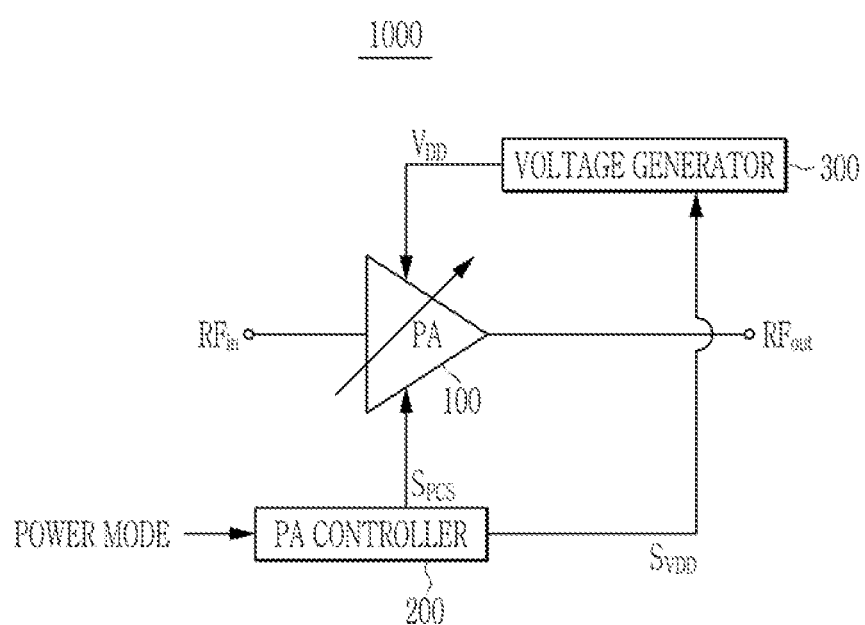
FIG. 1 illustrates an example power amplifier system, in accordance with one or more embodiments.

Hereinafter, embodiments of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms, "includes," "comprises," "is configured to," "has," etc. of the description specify the presence of stated features, numbers, steps, operations, members, elements, parts, and/or combinations thereof, but do not preclude the presence or addition of one or more other features, numbers, steps, operations, members, elements, parts, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Due to manufacturing techniques and/or tolerances, variations of the shapes shown in the drawings may occur. Thus, the examples described herein are not limited to the specific shapes shown in the drawings, but include changes in shape that occur during manufacturing.

Throughout the disclosure, RF signals may include Wi-Fi (IEEE 802.11 family, etc.), WMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter, but the examples are not limited thereto.

FIG. 1 illustrates an example power amplifier system 1000, in accordance with one or more embodiments.

As illustrated in FIG. 1, the power amplifier system 1000 may include a power amplifier 100, a power amplifier (PA) controller 200, and a voltage generator 300.

The power amplifier 100 may receive an RF input signal RFin, amplify the received RF input signal RFin at a predetermined ratio, and generate an RF output signal RFout. The power amplifier 100 may be configured in several stages, and the power amplifier 100 to be described below may be a power amplifier corresponding to any one stage among the several stages. As an example, the power amplifier 100 may be a power amplifier corresponding to a driver stage.

Figure 2:
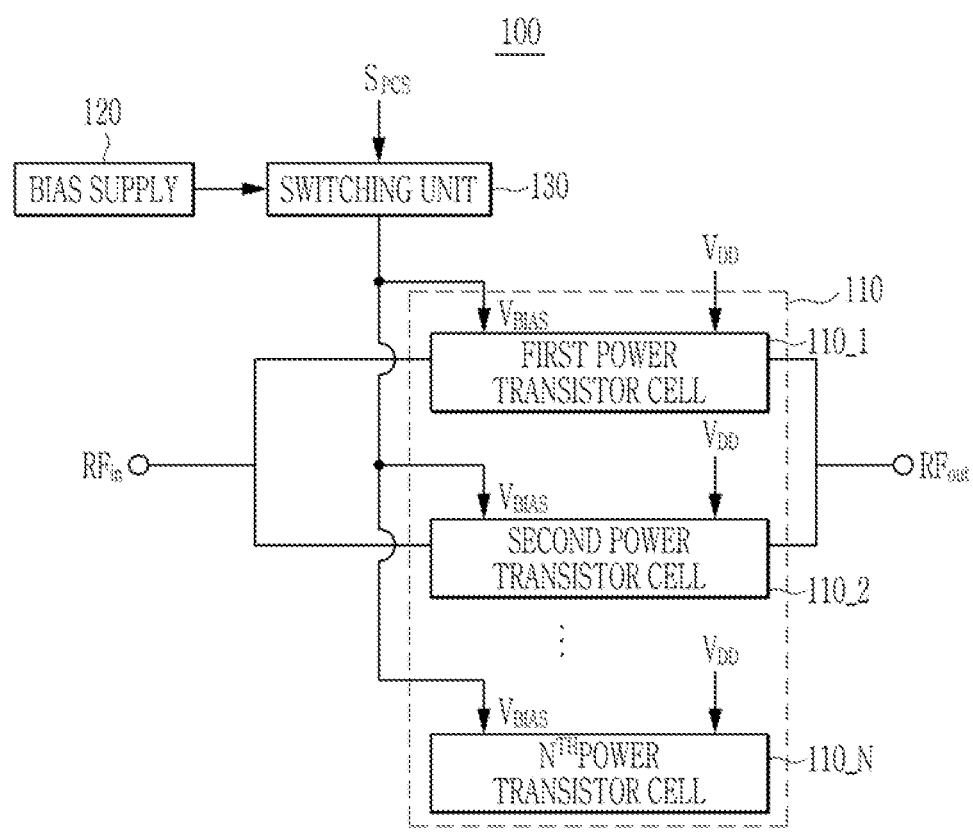
FIG. 2 illustrates an example power amplifier, in accordance with one or more embodiments.

Referring to FIG. 2, the power amplifier 100, in accordance with one or more embodiments, may include a plurality of power transistor cells 110. The power transistor cells 110 included in the power amplifier 100 may be turned on or off by a cell switching signal Secs of the PA controller 200. A detailed description of the power amplifier 100 will be described in more detail with reference to FIG. 2.

Referring again to FIG. 1, the PA controller 200 may receive an input of a power mode, and control the power amplifier 100 and the voltage generator 300 based on the power mode. The power amplifier system 1000 may operate in a plurality of power modes. Herein, the power modes may be divided into a high-power mode (HPM), a middle-power mode (MPM), and a low-power mode (LPM), depending on the output power of the power amplifier system 1000.

When the power amplifier system 1000 is mounted on a portable device, for example, a mobile phone device, the mobile phone device may set different power modes depending on a distance that the mobile device is from the base station. When the mobile phone device is far away from the base station, the power amplifier system 1000 may operate in the high-power mode (HPM), and when the mobile phone device is located close to the base station, the power amplifier system 1000 may operate in the low-power mode (LPM). In an example, the power mode may be input from a modem. Hereinafter, for better understanding and ease of description, an example in which the power mode is divided into the high-power mode (HPM) and the low-power mode (LPM) will be described, but the examples may be applied to various other power modes.

The PA controller 200 may generate a voltage control signal $S_{VDD}$ to control a voltage level of the voltage generator 300, and a voltage control signal $S_{VDD}$ to control switching of the power amplifier 100 depending on the power mode. In the example of the high-power mode (HPM), the PA controller 200 may output a voltage control signal $S_{VDD\_H}$ corresponding to the high-power mode (HPM) to the voltage generator 300. Additionally, in the example of the low-power mode (LPM), the PA controller 200 may output a voltage control signal $S_{VDD\_L}$ corresponding to the low-power mode (LPM) to the voltage generator 300. In an example, the PA controller 200 may be implemented as a mobile industry processor interface (MIPI).

The voltage generator 300 may generate a power supply voltage $V_{DD}$ based on a voltage control signal $S_{VDD}$ that is inputted from the PA controller 200. The voltage generator 300 may supply the generated power supply voltage $V_{DD}$ to the power amplifier 100, and the power amplifier 100 is biased to the power supply voltage $V_{DD}$ to operate. When receiving the voltage control signal $S_{VDD\_H}$ corresponding to the high-power mode (HPM) from the PA controller 200, the voltage generator 300 may generate a high-power supply voltage $V_{DD\_H}$, and supply the generated high-power supply voltage $V_{DD\_H}$ to the power amplifier 100. When receiving the voltage control signal $S_{VDD\_H}$ corresponding to the low-power mode (LPM) from the PA controller 200, the voltage generator 300 may generate a low-power supply voltage $V_{DD\_L}$, and supply the generated low-power supply voltage $V_{DD\_L}$ to the power amplifier 100. The high-power supply voltage $V_{DD\_H}$ has a higher voltage level than the low-power supply voltage $V_{DD\_L}$. That is, the level of the power supply voltage $V_{DD}$ may vary depending on the power mode. As non-limiting examples, the voltage generator 300 may be implemented as a DC-DC converter, a regulator, or a low-dropout (LDO) regulator.

The PA controller 200 may generate a cell switching signal $S_{PCS}$ to switch the power amplifier 100 based on the power mode. The cell switching signal $S_{PCS}$ may include a signal $S_{PCS\_ON}$ to turn on the power transistor cells included in the power amplifier 100 and a signal $S_{PCS\_OFF}$ to turn off the power transistor cells included in the power amplifier 100. That is, the power transistor cells 110 included in the power amplifier 100 may be turned on or off by the cell switching signal $S_{PCS}$ of the PA controller 200.

FIG. 2 illustrates an example power amplifier 100, in accordance with one or more embodiments As illustrated in FIG. 2, the example power amplifier 100 may include a plurality of power transistor cells 110, a bias supply 120, and a switching unit 130.

The power transistor cells 110 may include a first power transistor cell 110_1, a second power transistor cell 110_2, and an $N^{th}$ power transistor cell 110_N. Herein, N may be a natural number of 2 or more. The power transistor cells 110 may include N or more power transistor cells in order to precisely control a power depending on a power mode. Hereinafter, for better understanding and ease of description, an example where the power transistor cells 110 are configured to include a first power transistor cell 110_1 and a second power transistor cell 110_2 is described as an example, but it may be applied to two or more power transistor cells.

The power transistor cells 110 respectively receive the power supply voltage $V_{DD}$ and a bias voltage $V_{BIAS}$ to operate. The power supply voltage $V_{DD}$ may be inputted from the voltage generator 300 into a first terminal (e.g., drain) of each of the power transistor cells 110. The bias voltage $V_{BIAS}$ may be inputted from the bias supply 120 and the switching unit 130 into a control terminal (e.g., gate) of each of the power transistor cells 110. Each of the power transistor cells 110 is turned on to operate when the bias voltage $V_{BIAS}$ is received (supplied) thereto. Additionally, each of the power transistor cells 110 is turned off to not operate when the bias voltage $V_{BIAS}$ is not received (supplied) thereto.

The bias supply 120 generates the bias voltage $V_{BIAS}$, and outputs (supplies) the generated bias voltage $V_{BIAS}$ to the switching unit 130. A method by which the bias supply 120 generates the bias voltage $V_{BIAS}$ will be described in detail with reference to FIG. 4.

The switching unit 130 receives the bias voltage $V_{BIAS}$ from the bias supply 120 and the cell switching signal $S_{PCS}$ from the PA controller 200. The switching unit 130 switches supply of the bias voltage $V_{BIAS}$ based on the cell switching signal $S_{PCS}$. In an example, when receiving a signal $S_{PCS\_ON}$ to turn on both the first and second power transistor cells 110_1 and 110_2 from the PA controller 200, the switching unit 130 supplies the bias voltage $V_{BIAS}$ to the first and second power transistor cells 110_1 and 110_2. Additionally, when receiving a signal $S_{PCS\_ON}$ to turn on the first power transistor cell 110_1 and a signal $S_{PCS\_OFF}$ to turn off the second power transistor cell 110_2 from the PA controller 200, the switching unit 310 supplies the bias voltage $V_{BIAS}$ to the first power transistor cell 110_1 and does not supply the bias voltage $V_{BIAS}$ to the second power transistor cell 110_2.

Figure 3:
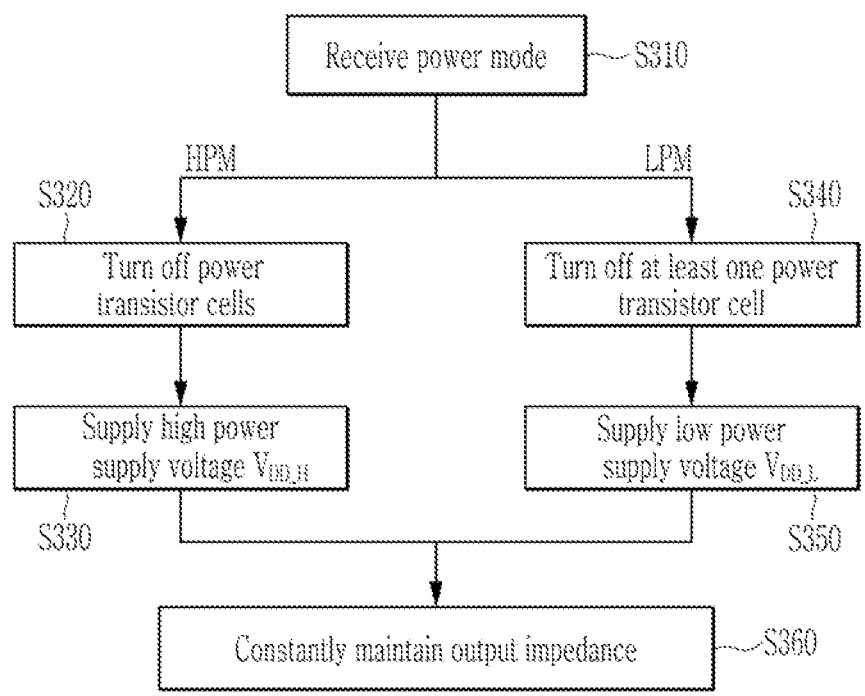
FIG. 3 illustrates a flowchart showing an operating method of an example power amplifier system, in accordance with one or more embodiments.

FIG. 3 illustrates a flowchart showing an operating method of a power amplifier system 1000, in accordance with one or more embodiments.

First, the power amplifier system 1000 receives a power mode from an external device (e.g., modem) (operation S310). That is, the PA controller 200 may receive the input of the power mode, and determine whether the inputted power mode is the high-power mode (HPM) or the low-power mode (LPM).

When the power mode is the high-power mode (HPM), the power amplifier system 1000 turns on all of the power transistor cells 110 (operation S320). That is, in the example of the high-power mode (HPM), the PA controller 200 generates a signal $S_{PCS\_ON}$ to turn on the plurality of power transistor cells 110, and this cell switching signal $S_{PCS\_ON}$ is inputted into the switching unit 130. In this example, the switching unit 130 supplies the bias voltage $V_{BIAS}$ to the power transistor cells 110 to correspond to the cell switching signal $S_{PCS\_ON}$. Accordingly, the power transistor cells 110 are turned on.

When the power mode is the high-power mode (HPM), the power amplifier system 1000 supplies a high-power supply voltage $V_{DD\_H}$ to the power transistor cells 110 (operation S330). That is, in the example of the high-power mode (HPM), the PA controller 200 outputs a voltage control signal $S_{VDD\_H}$ corresponding to the high-power mode (HPM) to the voltage generator 300. The voltage generator 300 generates a high-power supply voltage $V_{DD\_H}$ to correspond to the voltage control signal $S_{VDD\_H}$. This high-power supply voltage $V_{DD\_H}$ is applied (supplied) to the power transistor cells 110.

When the power mode is the low-power mode (LPM), the power amplifier system 1000 turns off at least one of the power transistor cells 110 (operation S340). That is, in the example of the low power mode (LPM), the PA controller 200 generates a cell switching signal $S_{PCS\_OFF}$ to turn off at least one of the power transistor cells 110, and this cell switching signal $S_{PCS\_OFF}$ is inputted into the switching unit 130. In this example, the switching unit 130 does not supply the bias voltage $V_{BIAS}$ to at least one power transistor cell (e.g., 110_2) in response to the cell switching signal $S_{PCS\_OFF}$ to turn off at least one power transistor cell (e.g., 110_2). Accordingly, at least one power transistor cell is turned off.

When the power mode is the low-power mode (LPM), the power amplifier system 1000 supplies a low-power supply voltage $V_{DD\_L}$ to the power transistor cells 110 (operation S350). That is, in the example of the low-power mode (LPM), the PA controller 200 outputs a voltage control signal $S_{VDD\_L}$ corresponding to the low-power mode (LPM) to the voltage generator 300. The voltage generator 300 generates a low-power supply voltage $V_{DD\_L}$ to correspond to the voltage control signal $S_{VDD\_L}$. This low supply voltage $V_{DD\_H}$ is applied (supplied) to the power transistor cells 110.

Through this operation, the power amplifier system 1000, according to an example, may maintain constant output impedance (operation S360). That is, the power amplifier system 1000 may maintain the constant output impedance by selectively switching the power transistor cells 110 and adjusting the power supply voltage $V_{DD}$ depending on the power mode. A method of constantly maintaining the output impedance based on the power mode will be described in more detail with reference to FIG. 4. Accordingly, the power amplifier system 1000, in accordance with one or more embodiments, may constantly maintain the output impedance based on the power mode even when there is no separate circuit for tuning a load at an output side.

Figure 4:
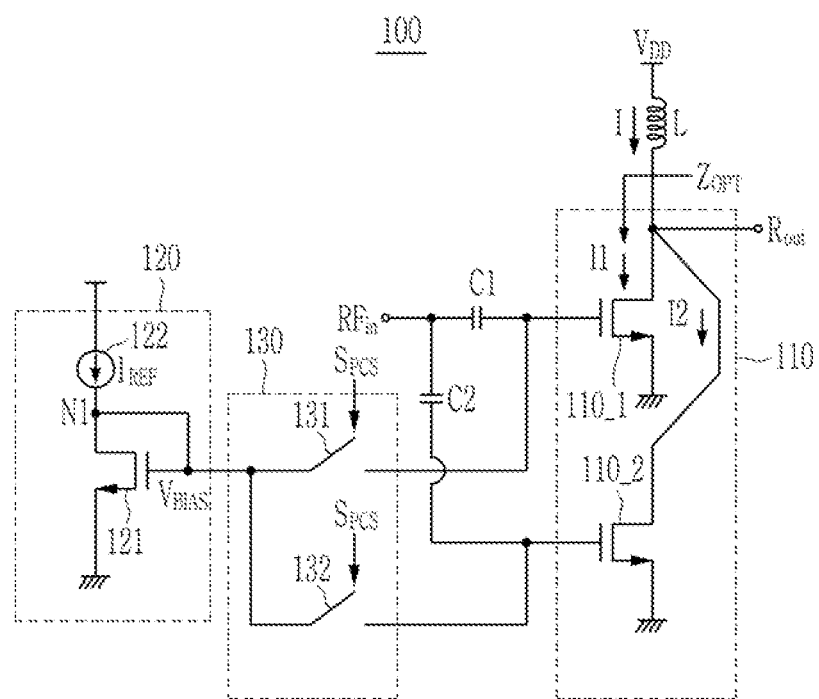
FIG. 4 illustrates a circuit diagram showing a specific configuration of an example power amplifier, in accordance with one or more embodiments

FIG. 4 illustrates a circuit diagram showing a specific configuration of the power amplifier 100, in accordance with one or more embodiments. In FIG. 4, for better understanding and ease of description, it is assumed that the power transistor cells 110 are configured to include a first power transistor cell 110_1 and a second power transistor cell 110_2.

As illustrated in FIG. 4, the bias supply 120 may include a transistor 121 and a current source 122.

A gate and a drain of the transistor 121 may be connected to each other, and a source of the transistor 121 is connected to a ground. Power of the current source 122 is applied to a contact N1 between the gate and the drain of the transistor 121. A gate or drain voltage of the transistor 121 corresponds to the bias voltage $V_{BIAS}$. Herein, a current value $I_{REF}$ of the current source 122 may be changed to set a class of the power amplifier 100.

The switching unit 130 may include a first switch 131 and a second switch 132.

The first switch 131 may be connected between a gate of the transistor 121 and a gate of the first power transistor cell 110_1. The first switch 131 may be turned on or off by the cell switching signal $S_{PCS}$. That is, the first switch 131 may be turned on by the cell switching signal $S_{PCS\_ON}$ and may be tuned off by the cell switching signal $S_{PCS\_OFF}$.

When the first switch 131 is turned on, the bias voltage $V_{BIAS}$ is applied to the gate of the first power transistor cell 110_1, allowing the first power transistor cell 110_1 to be in a state that performs a power amplification operation (i.e., a turn-on state). Herein, when the first switch 131 is turned on, the transistor 121 and the first power transistor cell 110_1 may have a current mirror structure with respect to each other, and as a result, the first power transistor cell 110_1 may be biased to perform a power operation. That is, when the first switch 131 is turned on, the first power transistor cell 110_1 is turned on.

In an example, when the first switch 131 is turned off, the bias voltage $V_{BIAS}$ is not applied to the gate of the first power transistor cell 110_1 to be blocked, allowing the first power transistor cell 110_1 to be in a state that it is unable to perform a power amplification operation (i.e., a turn-off state). Herein, when the first switch 131 is turned off, the transistor 121 and the first power transistor cell 110_1 may have no current mirror structure with respect to each other, and as a result, the first power transistor cell 110_1 may be biased to be unable to perform the power operation. That is, when the first switch 131 is turned off, the first power transistor cell 110_1 is off.

Additionally, the second switch 132 is connected between the gate of the transistor 121 and a gate of the second power transistor cell 110_2. The second switch 132 is turned on or off by the cell switching signal Secs. That is, the second switch 132 is turned on by the cell switching signal $S_{PCS\_ON}$ and is tuned off by the cell switching signal $S_{PCS\_OFF}$.

When the second switch 132 is turned on, the bias voltage $V_{BIAS}$ is applied to the gate of the second power transistor cell 110_2, allowing the second power transistor cell 110_1 to be in the state to perform the power amplification operation (i.e., a turn-on state). Herein, when the second switch 132 is turned on, the transistor 121 and the second power transistor cell 110_2 may have a current mirror structure with respect to each other, and as a result, the second power transistor cell 110_2 may be biased to perform the power operation. That is, when the second switch 132 is turned on, the second power transistor cell 110_2 is turned on.

In an example, when the second switch 132 is turned off, the bias voltage $V_{BIAS}$ is not applied to the gate of the second power transistor cell 110_2 to be blocked, allowing the second power transistor cell 110_1 to be in a state that it is unable to perform the power amplification operation (i.e., the turn-off state). Herein, when the second switch 132 is turned off, the transistor 121 and the second power transistor cell 110_2 may have no current mirror structure with respect to each other, and as a result, the second power transistor cell 110_2 may be biased to be unable to perform the power operation. That is, when the second switch 132 is turned off, the second power transistor cell 110_2 is turned off.

The power transistor cells 110 may include the first power transistor cell 110_1 and the second power transistor cell 110_2.

The gate of the first power transistor cell 110_1 receives an RF input signal RFin through a coupling capacitor C1. Additionally, the gate of the first power transistor cell 110_1 receives the bias voltage $V_{BIAS}$ through the first switch 131. A source of the first power transistor cell 110_1 is connected to a ground, and the power supply voltage $V_{DD}$ is applied to a drain of the first power transistor cell 110_1. In an example, an inductor L may be positioned between the drain of the first power transistor cell 110_1 and the power supply voltage $V_{DD}$, and may perform an RF choke function. In FIG. 4, the drain current of the first power transistor cell 110_1 is represented by $I_1$.

A gate of the second power transistor cell 110_2 receives the RF input signal RFin through a coupling capacitor C2. Additionally, the gate of the second power transistor cell 110_2 receives the bias voltage $V_{BIAS}$ through the second switch 132. A source of the second power transistor cell 110_2 is connected to the ground, and the power supply voltage $V_{DD}$ is applied to a drain of the second power transistor cell 110_2. The drain of the first power transistor cell 110_1 and the drain of the second power transistor cell 100_2 may be connected to each other, and the RF output signal RFout is outputted at a connected point thereof. In an example, the inductor L may be positioned between the drain of the second power transistor cell 110_2 and the power supply voltage $V_{DD}$, and may perform the RF choke function. In FIG. 4, the drain current of the first power transistor cell 110_1 is represented by $I_2$.

In FIG. 4, output impedance of the power amplifier 100 is indicated by '$Z_{OPT}$', and the output impedance $Z_{OPT}$, which is impedance of the RF output signal RFout, may be used interchangeably with a term 'load impedance'.

In the following, an operation of the power amplifier 100 of FIG. 4 according to the power mode will be described with reference to FIG. 5A and FIG. 5B.

Figure 5A:
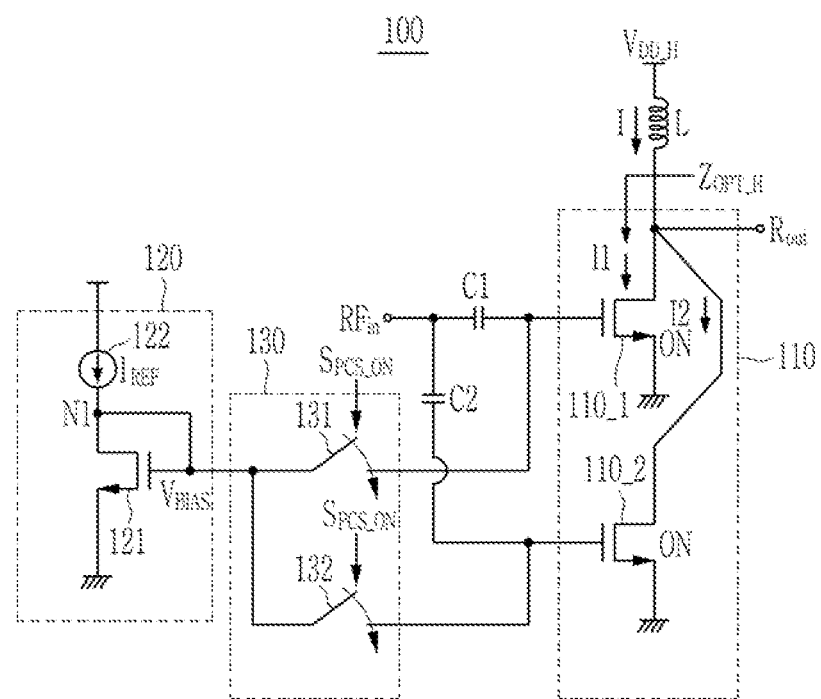
FIG. 5A illustrates an operation of an example power amplifier in a high-power mode (HPM), in accordance with one or more embodiments.

FIG. 5A illustrates an operation of an example power amplifier 100 in the high-power mode (HPM), in accordance with one or more embodiments.

Referring to FIG. 5A, in the example of the high-power mode (HPM), the first switch 131 and the second switch 132 are turned on. That is, the PA controller 200 generates a cell switching signal $S_{PCS\_ON}$ to turn on the first and second power transistor cells 110_1 and 110_2, and applies the cell switching signal $S_{PCS\_ON}$ to the first and second switches 131 and 132. Additionally, in the example of the high-power mode, the power supply voltage $V_{DD}$ is set as the high-power supply voltage $V_{DD\_H}$. That is, in the example of the high-power mode, the voltage generator 300 generates the high-power supply voltage $V_{DD\_H}$ and supplies the generated high-power supply voltage $V_{DD\_H}$ to the power amplifier 100.

The bias voltage $V_{BIAS}$ is applied to the gate of the first power transistor cell 110_1 by turning on the first switch 131, allowing the first power transistor cell 110_1 to be in a state to perform power amplification (i.e., the turn-on state). That is, the transistor 121 and the first power transistor cell 110_1 may have a current mirror structure with respect to each other by the turning-on of the first switch 131, and as a result, the first power transistor cell 110_1 may be biased to perform a power operation. That is, the first power transistor cell 110_1 is turned on by the turning-on of the first switch 131, and a current I1 flows to the drain of the first power transistor cell 110_1.

The bias voltage $V_{BIAS}$ is applied to the gate of the second power transistor cell 110_2 by turning on the second switch 132, allowing the second power transistor cell 110_2 to be in a state capable of performing power amplification (i.e., the turn-on state). That is, the transistor 121 and the second power transistor cell 110_2 may have a current mirror structure with respect to each other by the turning-on of the second switch 132, and as a result, the second power transistor cell 110_2 may be biased to perform a power operation. That is, the second power transistor cell 110_2 is turned on by the turning-on of the second switch 132, and a current I2 flows to the drain of the second power transistor cell 110_2.

Herein, a current flowing from the power supply voltage $V_{DD}$ to the drains of the first and second power transistors 110_1 and 110_2 is represented by I. The current I, the current I1, and the current I2 have a relationship of Equation 1 below.

$$I = I1 + I2 \qquad \text{Equation 1:}$$

Additionally, when the output impedance $Z_{OPT}$ of the high-power mode is indicated as '$Z_{OPT\_H}$', output impedance $Z_{OPT\_H}$ is the same as in Equation 2 below.

$$Z_{OPT\_H} = \frac{V_{DD\_H}}{I} = \frac{V_{DD\_H}}{I1 + I2} \qquad \text{Equation 2:}$$

The impedance indicates a ratio of a voltage and a current, and in the example of the high-power mode, the power supply voltage $V_{DD}$ is set as the high-power supply voltage $V_{DD\_H}$, so the output impedance $Z_{OPT\_H}$ becomes equal to Equation 2.

Figure 5B:
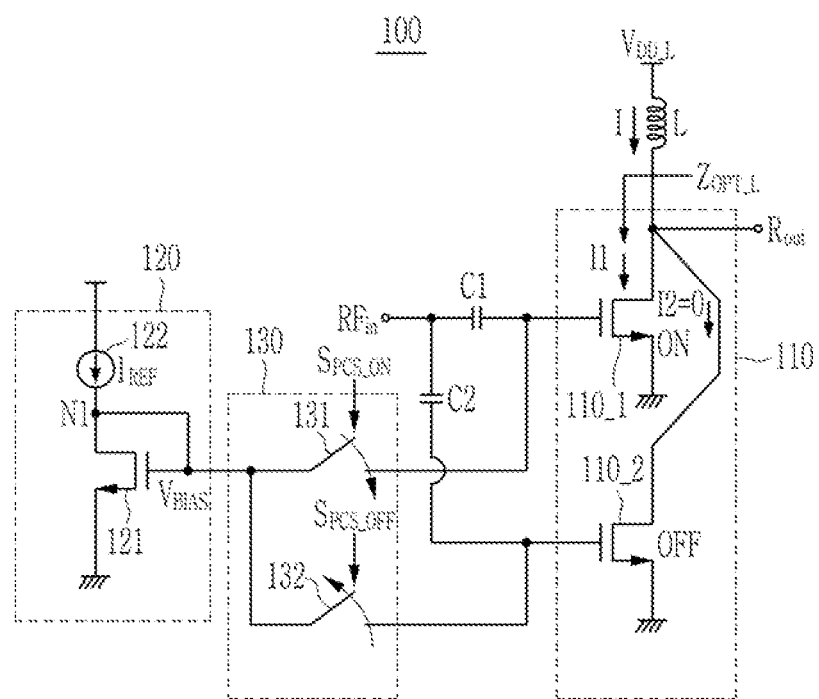
FIG. 5B illustrates an operation of an example power amplifier in a low power mode (LPM), in accordance with one or more embodiments.

FIG. 5B illustrates an operation of the power amplifier 100 of FIG. 4 in the low-power mode (LPM).

As illustrated in FIG. 5B, in the example of the low-power mode (LPM), the first switch 131 is turned on, and the second switch 132 is turned off. In an example, in the example of the low-power mode (LPM), the first switch 131 may be turned off and the second switch 132 may be turned on, and an operation to be described below may be applied in a same manner. The PA controller 200 may generate a cell switching signal $S_{PCS\_ON}$ to turn on the first power transistor cell 110_1, and apply the cell switching signal $S_{PCS\_ON}$ to the first switch 131. Additionally, the PA controller 200 may generate a cell switching signal $S_{PCS\_OFF}$ to turn on the second power transistor cell 110_2, and apply the cell switching signal $S_{PCS\_OFF}$ to the second switch 132. On the other hand, in the example of the high-power mode, the power supply voltage $V_{DD}$ is set as the low-power supply voltage $V_{DD\_L}$. That is, in the example of the low power mode, the voltage generator 300 may generate the low-power supply voltage $V_{DD\_L}$ and supply the generated low-power supply voltage $V_{DD\_L}$ to the power amplifier 100.

The bias voltage $V_{BIAS}$ may be applied to the gate of the first power transistor cell 110_1 by turning-on of the first switch 131, allowing the first power transistor cell 110_1 to be in a state to perform power amplification (i.e., the turn-on state). That is, the transistor 121 and the first power transistor cell 110_1 may have a current mirror structure with respect to each other by the turning on the first switch 131, and as a result, the first power transistor cell 110_1 may be biased to perform a power operation. That is, the first power transistor cell 110_1 is turned on by the turning-on of the first switch 131, and a current I1 flows to the drain of the first power transistor cell 110_1.

The bias voltage $V_{BIAS}$ is not applied to the gate of the second power transistor cell 110_2 to be blocked by turning off the second switch 132, allowing the second power transistor cell 110_2 to be in a state that is unable to perform power amplification (i.e., the turn-off state). That is, when the second switch 132 is turned off, the transistor 121 and the second power transistor cell 110_2 may form no current mirror structure with respect to each other, and as a result, the second power transistor cell 110_2 may be biased to be unable to perform the power operation. That is, the second power transistor cell 110_2 is turned off by the turning-off of the second switch 132, and no current I2 flows to the drain of the second power transistor cell 110_2. In other words, I2=0 by turn-on of the second switch 132.

Since I2=0, the current I obtains a value as indicated in Equation 3 below.

$$I = I1 \qquad \text{Equation 3:}$$

Additionally, when the output impedance $Z_{OPT}$ of the low power mode is indicated as '$Z_{OPT\_L}$', output impedance $Z_{OPT\_L}$ is the same as in Equation 4 below.

$$Z_{OPT\_L} = \frac{V_{DD\_L}}{I} = \frac{V_{DD\_L}}{I1} \qquad \text{Equation 4:}$$

The impedance indicates a ratio of a voltage and a current, and in the example of the low-power mode, the power supply voltage $V_{DD}$ is set as the high-power supply voltage $V_{DD\_L}$, so the output impedance $Z_{OPT\_L}$ becomes equal to Equation 4.

Referring to Equation 2 and Equation 4, it can be seen that the output impedance $Z_{OPT\_H}$ of the high-power mode and the output impedance $Z_{OPT\_L}$ of the low-power mode can be constantly maintained. In the example of the low power mode, the current I2 does not flow (I2=0), but is set as the low voltage $V_{DD\_L}$ which is the low-power supply voltage $V_{DD}$, so a value of the output impedance may be kept constant.

Figure 6:
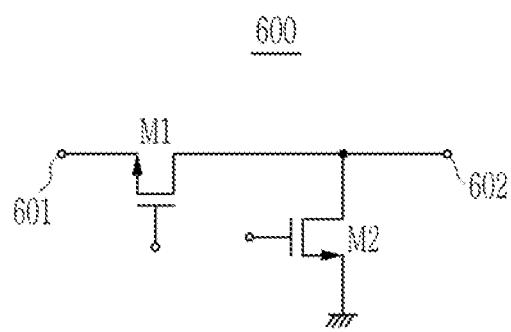
FIG. 6 illustrates an example switch, in accordance with one or more embodiments.

FIG. 6 illustrates a switch 600, in accordance with one or more embodiments.

The switch 600 illustrated in FIG. 6 may be the first switch 131 or the second switch 132 described above. A first end 601 of the switch 600 may correspond to a terminal connected to a gate of the transistor 121 among opposite terminals of the first switch 131, and a second end 602 of the switch 600 may correspond to a terminal connected to a gate of the first power transistor cell 110_1 among the opposite terminals of the first switch 131. Additionally, the first end 601 of the switch 600 may correspond to a terminal connected to the gate of the transistor 121 among opposite terminals of the second switch 132, and the second end 602 of the switch 600 may correspond to a terminal connected to the gate of the second power transistor cell 110_2 among the opposite terminals of the second switch 132.

The switch 600 may include a transistor M1 and a transistor M2.

A source of the transistor M1 is connected to the first end 601 of the switch 600, and a drain of transistor M1 is connected to the second end 602 of the switch 600. In addition, a drain of transistor M2 is connected to the second end 602 of the switch 600, and a source of transistor M2 is connected to a ground. Additionally, a switching control signal (i.e., the cell switching signal $S_{PCS}$) is inputted into a gate of each of the transistors M1 and M2.

When the switch 600 is turned on, the transistor M1 is turned on and the transistor M2 is turned off. Accordingly, signals are transferred to the opposite ends of the switch 600.

When the switch 600 is turned off, the transistor M1 is turned off and the transistor M2 is turned on. Accordingly, no signals are transferred to the opposite ends of the switch 600, and the signal of the second end 602 of the switch 600 is bypassed to the ground by the transistor M2. Referring to FIG. 6 and FIG. 4, when the second switch 132 is turned off to turn off the second power transistor cell 110_2, the transistor M1 is turned off and the transistor M2 is turned on. In this example, since the gate of second power transistor cell 110_2 is connected to the ground through the transistor M2, the second power transistor cell 110_2 is turned off.

Figure 7:
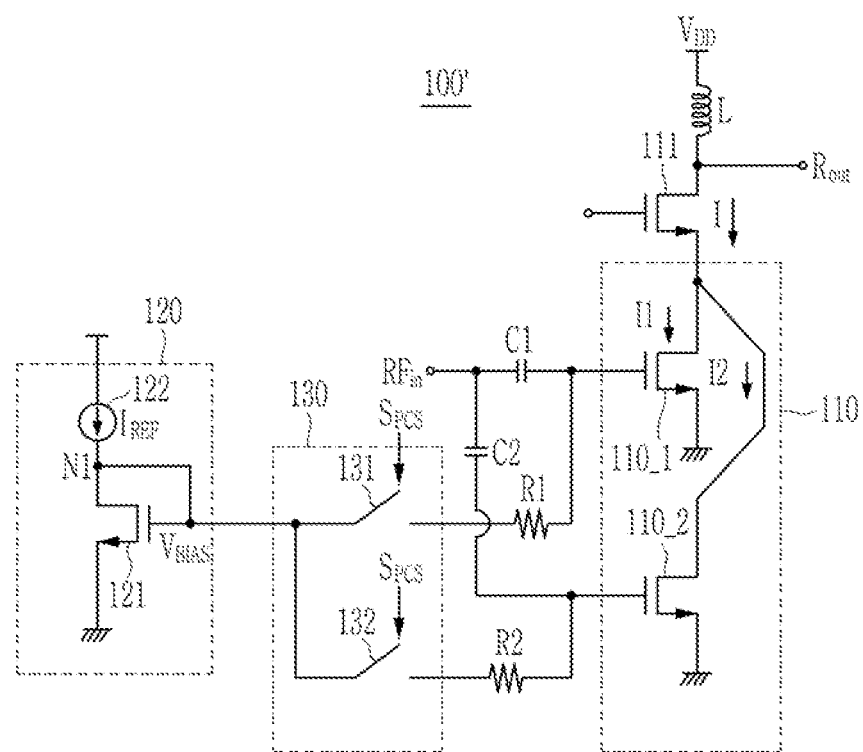
FIG. 7 illustrates a circuit diagram showing a specific configuration of an example power amplifier, in accordance with one or more embodiments.

FIG. 7 illustrates a circuit diagram showing a specific configuration of a power amplifier 100, in accordance with one or more embodiments. The power amplifier 100' of FIG. 7 may be the same as the power amplifier 100 of FIG. 4, except that resistors R1 and R2 and a transistor 111 are added, and thus a redundant description will be omitted.

The resistors R1 and R2 may be connected between the switching unit 130 and the power transistor cells 110. Specifically, the resistor R1 may be connected between the first end of the first switch 131 and the gate of the first power transistor cell 110_1. The resistor R2 may be connected between the first end of the second switch 132 and the gate of the second power transistor cell 110_2. The resistors R1 and R2 may each serve as isolation resistors that prevent a flow of the RF input signal RFin to the bias supply 120.

As illustrated in FIG. 7, the transistor 111 may be connected to the power transistor cells 110 by using a cascode. The drain of the transistor 111 is connected to the power supply voltage $V_{DD}$ through the inductor L, and a source of the transistor 111 is connected to the drains of the first and second power transistor cells 110_1 and 110_2. The RF output signal RFout is outputted from the drain of the transistor 111. Additionally, a predetermined bias voltage may be applied to a gate of the transistor 111. The transistor 111 having such a connection structure can compensate for a Miller effect. That is, since a parasitic capacitance component of the transistor 111 and parasitic capacitance components of the power transistor cells 110 are connected in series with each other, the Miller effect can be compensated.

In an example, in the above description, each of the power transistor cells 110 exhibited only a single-ended power amplifier structure, but each of the power transistor cells 110 may have a differential power amplifier structure. In the differential power amplification structure, the above description may be applied as it is.

Figure 8A:
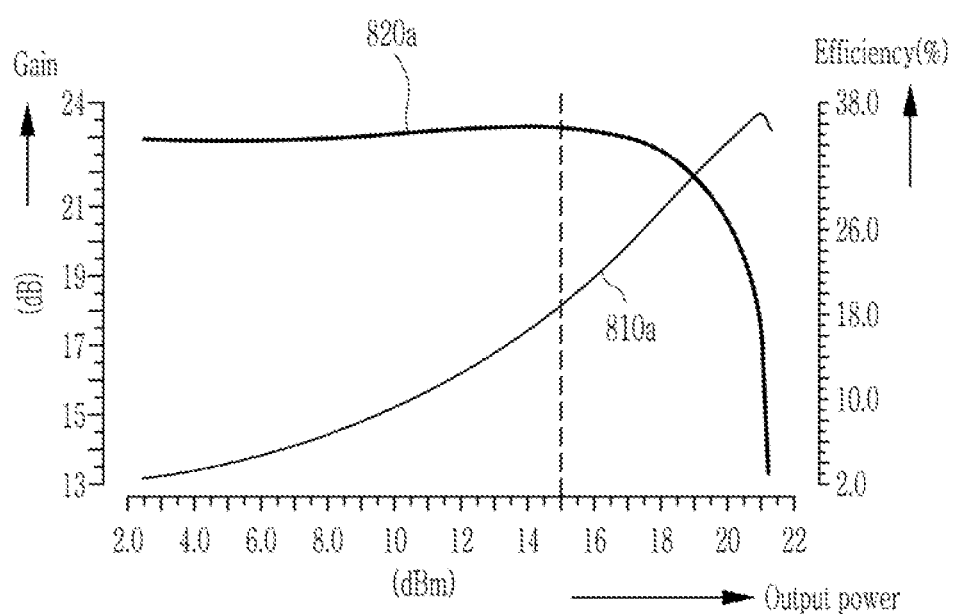
FIG. 8A illustrates a simulation result of an example power amplifier system in a high-power mode (HPM)
Figure 8B:
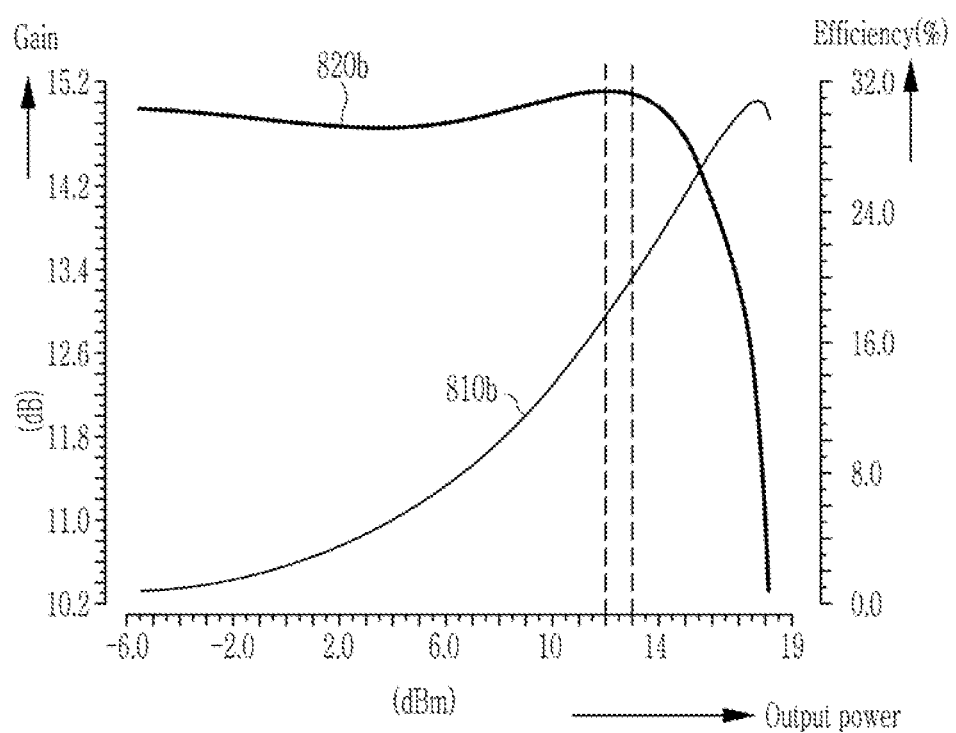
FIG. 8B illustrates a simulation result of an example power amplifier system in a low-power mode (LPM), in accordance with one or more embodiments.

FIG. 8A illustrates a simulation result of the example power amplifier system 1000 in the high-power mode (HPM), and FIG. 8B illustrates a simulation result of the example power amplifier system 1000 in the low power mode (LPM).

Referring to FIG. 8A, 810*a* denotes efficiency (%) (vertical axis) according to output power (dBm) (horizontal axis), and 820*a* denotes gain (dB) (vertical axis) according to output power (dBm) (horizontal axis). Herein, a maximum output power is 21 dBm. Referring to FIG. 8A, the efficiency is 19% at an output power of about 15 dBm. In an example, during simulation, the power supply voltage $V_{DD}$ is set to 1.5 V.

Referring to FIG. 8B, 810*b* denotes efficiency (%) (vertical axis) according to output power (dBm) (horizontal axis), and 820*b* denotes gain (dB) (vertical axis) according to output power (dBm) (horizontal axis). Herein, the maximum output power of FIG. 8B is 18 dBm, and the power is set to a power that is smaller by 3 dB than that of FIG. 8A (i.e., high-power mode). Referring to FIG. 8B, the efficiency is about 17.7% at 12 dBm, which is a 3 dB backoff compared to the output power (15 dBm) of the high-power mode (FIG. 8A). That is, it can be seen that the high efficiency is maintained even in the low power mode. This result is because optimal output impedance may be maintained even in the low power mode without tuning of the load impedance. To this end, in the above examples, optimal output impedance was identically maintained by switching at least one power transistor cell and adjusting the power supply voltage $V_{DD}$.

Figure 9:
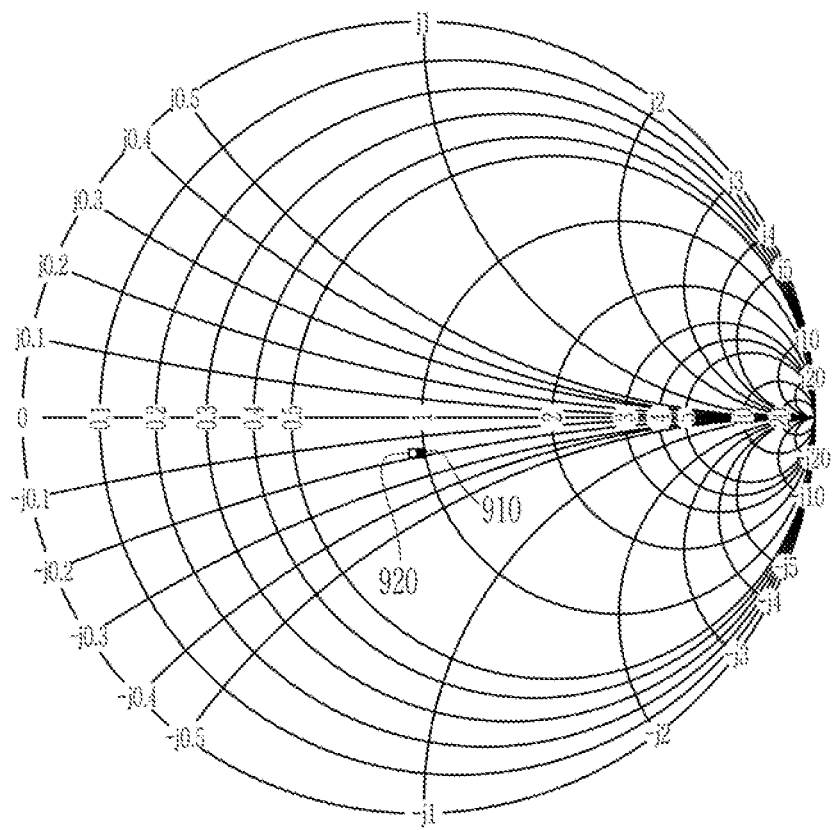
FIG. 9 illustrates a simulation result for optimal output impedance of an example power amplifier system, in accordance with one or more embodiments.

In the above examples, a phenomenon in which the optimal output impedance is constantly maintained even when the power mode is changed can be confirmed through a simulation of FIG. 9.

FIG. 9 illustrates a simulation result for optimal output impedance of an example power amplifier system 1000. Herein, FIG. 9 illustrates a result of simulating the output impedance under the same conditions as in FIG. 8A and FIG. 8B.

In FIG. 9, 910 denotes optimal output impedance in the high-power mode (HPM), and 920 denotes optimal output impedance in the low power mode (LPM). Referring to 910 and 920, it can be seen that there is little change in the output impedance depending on the power mode. Accordingly, the examples described above may have optimized power amplifier performance.

In the above description, the transistors 121, 111, M1, and M2 and the power transistor cells 110_1, 110_2, . . . , and 110_N are field effect transistors (FETs), metal oxide semiconductor field effect transistors (MOSFETs), or bipolar junction transistors (BJTs).

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier system comprising:
   a power amplifier comprising a plurality of power transistor cells, each of the plurality of power transistor cells being configured to receive a radio frequency (RF) signal through a control terminal, and amplify the received RF signal;
   a power amplifier controller configured to control a turn-on operation and a turn-off operation of at least one power transistor cell among the plurality of power transistor cells based on a power mode; and
   a voltage generator configured to generate a power supply voltage and transmit the generated power supply voltage to first terminals of the power transistor cells, and change the power supply voltage based on the power mode.

2. The system of claim 1, wherein the power mode comprises a first power mode and a second power mode that outputs a lower power than a power of the first power mode, and
   the power amplifier controller is further configured to control the turn-off operation of the at least one power transistor cell in the second power mode.

3. The system of claim 2, wherein the voltage generator is further configured to:
   supply a power supply voltage having a first voltage to the first terminals of the power transistor cells in the first power mode, and
   supply a power supply voltage having a second voltage that is lower than the first voltage to the first terminals of the power transistor cells in the second power mode.

4. The system of claim 3, wherein the power amplifier controller is further configured to control the turn-on operation of the power transistor cells in the first power mode.

5. The system of claim 1, wherein the power amplifier further comprises:
   a bias supply configured to generate a bias voltage; and
   a switching unit configured to controllably supply the bias voltage to control terminals of the power transistor cells.

6. The system of claim 5, wherein the switching unit is further configured to not supply the bias voltage to the control terminal of the at least one power transistor cell to turn off the at least one power transistor cell.

7. The system of claim 5, wherein the power amplifier further comprises resistors respectively connected between the switching unit and the power transistor cells.

8. The system of claim 5, wherein the bias supply comprises:
   a first transistor comprising a control terminal and a first terminal connected to each other, and a second terminal connected to a ground; and
   a current source configured to supply a current to the control terminal and the first terminal of the first transistor,
   wherein the bias voltage is a voltage of the control terminal of the first transistor.

9. The system of claim 8, wherein the switching unit comprises a plurality of switches respectively connected to the control terminal of the first transistor and the control terminals of the power transistor cells.

10. The system of claim 8, wherein the power amplifier further comprises a second transistor connected in a cascode connection between first terminals of the power transistor cells and the power supply voltage.

11. A power amplifier comprising:
    a first power transistor cell configured to receive a radio frequency (RF) signal through a control terminal thereof, and amplify the received RF signal;
    a second power transistor cell configured to receive an RF signal through a control terminal thereof, and amplify the received RF signal;
    a bias supply configured to generate a bias voltage; and
    a switching unit configured to controllably supply the bias voltage to the control terminal of the first power transistor cell and the control terminal of the second power transistor cells based on a power mode,
    wherein a power supply voltage supplied to first terminals of the first and second power transistor cells is varied based on the power mode.

12. The power amplifier of claim 11, wherein the power mode comprises a first power mode, and a second power mode that outputs a lower power than a power of the first power mode, and
    the switching unit is further configured to supply the bias voltage to the control terminal of the first power transistor cell, and not supply the bias voltage to the control terminal of the second power transistor cell, in response to the power mode being the second power mode.

13. The power amplifier of claim 12, wherein the power supply voltage has a first voltage in the first power mode, and
    the power supply voltage has a second voltage that is smaller than the first voltage in the second power mode.

14. The power amplifier of claim 13, wherein the switching unit is further configured to supply the bias voltage to the control terminals of the first power transistor cell and the second power transistor cell in the first power mode.

15. The power amplifier of claim 11, wherein the switching unit comprises a first switch connected between the bias supply and the control terminal of the first power transistor cell, and
    a second switch connected between the bias supply and the control terminal of the second power transistor cell.

16. The power amplifier of claim 15, wherein the bias supply comprises:
    a first transistor comprising a control terminal and a first terminal connected to each other, and a second terminal connected to a ground; and
    a current source configured to supply a current to the control terminal and the first terminal of the first transistor,
    wherein the bias voltage is a voltage of the control terminal of the first transistor.

17. The power amplifier of claim 11, further comprising:
    a first resistor connected between the switching unit and the control terminal of the first power transistor cell; and
    a second resistor connected between the switching unit and the control terminal of the second power transistor cell.

18. An operating method of a power amplifier comprising a plurality of power transistor cells to amplify radio frequency (RF) signals, the method comprising:
- amplifying the RF signal while turning on the power transistor cells in a first power mode;
- amplifying the RF signal while turning off at least one power transistor cell among the power transistor cells in a second power mode that outputs a lower power than a power of the first power mode;
- supplying a first power supply voltage having a first voltage to first terminals of the power transistor cells in the first power mode; and
- supplying a second power supply voltage having a second voltage that is lower than the first voltage to the first terminals of the power transistor cells in the second power mode.

19. The operating method of claim 18, wherein the amplifying of the RF signal in the first power mode comprises supplying a bias voltage to control terminals of the power transistor cells, and
- the amplifying of the RF signal in the second power mode comprises blocking supply of the bias voltage to the control terminal of the at least one power transistor cell.

20. The operating method of claim 19, wherein the first power mode is a high-power mode, and the second power mode is a low-power mode.

* * * * *